United States Patent
Ezaki et al.

(10) Patent No.: US 7,349,244 B2
(45) Date of Patent: Mar. 25, 2008

(54) MAGNETIC MEMORY DEVICE

(75) Inventors: Joichiro Ezaki, Tokyo (JP); Yuji Kakinuma, Tokyo (JP)

(73) Assignee: TDK Corporation, Tokyo (JP)

( * ) Notice: Subject to any disclaimer, the term of this patent is extended or adjusted under 35 U.S.C. 154(b) by 58 days.

(21) Appl. No.: 11/459,479

(22) Filed: Jul. 24, 2006

(65) Prior Publication Data

US 2007/0019464 A1   Jan. 25, 2007

(30) Foreign Application Priority Data

Jul. 25, 2005   (JP) ............................. 2005-214151

(51) Int. Cl.
*G11C 11/00*   (2006.01)
(52) U.S. Cl. ................... 365/158; 365/230.06
(58) Field of Classification Search ................ 365/158, 365/230.06, 189.09, 189.11
See application file for complete search history.

(56) References Cited

U.S. PATENT DOCUMENTS

| 5,933,373 | A | 8/1999 | Takahashi |
| 6,445,612 | B1 | 9/2002 | Naji |
| 6,795,340 | B2 * | 9/2004 | Sakimura et al. ............ 365/171 |
| 6,930,911 | B2 * | 8/2005 | Ezaki et al. ................. 365/158 |
| 2002/0080644 | A1 | 6/2002 | Ito |
| 2006/0193165 | A1 | 8/2006 | Ezaki et al. |
| 2006/0239065 | A1 | 10/2006 | Ezaki et al. |

FOREIGN PATENT DOCUMENTS

JP   2004-119638   4/2004

OTHER PUBLICATIONS

U.S. Appl. No. 10/568,808 to Haratani et al., filed Feb. 21, 2006.
English language Abstract of JP 2004-119638.

* cited by examiner

*Primary Examiner*—Vu A. Le
(74) *Attorney, Agent, or Firm*—Greenblum & Bernstein, P.L.C.

(57) ABSTRACT

A magnetic memory device includes a plurality of storage cells disposed in two dimensions, read lines that supply a read current for reading information from a first power supply to the respective storage cells, and a second power supply that is connected to at least some of the read lines and applies an intermediate voltage, which is lower than the voltage supplied by the first power supply, to the connected read lines.

8 Claims, 6 Drawing Sheets

MAGNETIC MEMORY DEVICE

BACKGROUND OF THE INVENTION

1. Field of the Invention

The present invention relates to a magnetic memory device that is equipped with storage cells including magnetoresistive effect revealing bodies and is constructed so as to be capable of recording and reading out information.

2. Description of the Related Art

As one example of this type of magnetic memory device, the magnetic memory device disclosed by Japanese Laid-Open Patent Publication No. 2004-119638 proposed by the present applicant is known. This magnetic memory device is a magnetic random access memory (hereinafter, "MRAM") and as shown in FIG. 5, includes a memory cell group 14 where a large number of storage cells 1 are disposed in the direction of word lines (i.e., in the X direction) and in the direction of bit lines (i.e., in the Y direction) to construct a matrix as a whole, a plurality of read word lines 6 that are disposed in the X direction and a plurality of read bit lines 5 composed of pairs of lines 5a and 5b that are disposed in the Y direction. The storage cells 1 each include a pair of storage elements 1a and 1b. The storage elements 1a and 1b include magnetoresistive effect revealing bodies 2a and 2b constructed using GMR (Giant Magneto-Resistive) or TMR (Tunneling Magneto-Resistive) effect, and two diodes Da and Db, that are connected to the magnetoresistive effect revealing bodies 2a and 2b, respectively in series and prevent backflow. The storage elements 1a and 1b are disposed at each intersection of the read word lines 6 and the read bit lines 5. In each storage cell 1 disposed at an intersection, one end of the magnetoresistive effect revealing body 2a is connected via the diode Da to the read bit line 5a out of the read bit lines 5 and the other end of the magnetoresistive effect revealing body 2a is connected to the read word line 6. In the same way, one end of the other magnetoresistive effect revealing body 2b in the storage cell 1 is connected via the diode Db to the other read bit line 5b that is paired with the read bit line 5a and the other end of the magnetoresistive effect revealing body 2b is connected to the common read word line 6. In each storage cell 1, one piece of information (digital information that is "0" or "1") is stored based on whether the resistance of one out of the pair of magnetoresistive effect revealing bodies 2a and 2b is higher than the resistance of the other or lower than the resistance of the other.

Read circuits 23 (read circuits 23n and 23n+1 are shown in FIG. 5) for reading information stored in the storage cells 1 are connected to one end of each read bit line 5. Each read circuit 23 includes two switches (as one example, bipolar transistors Q1 and Q2 as semiconductor switches in FIG. 5) that are connected to the ends of the lines 5a and 5b that construct a read bit line 5, two sensing resistors R1 and R2 which each have one end connected to a power supply voltage Vcc and the other end connected via the bipolar transistors Q1 and Q2 to the lines 5a and 5b, and a circuit (for example, a differential amplifier circuit) 42 that reads and outputs information stored in a storage cell 1 by amplifying the difference between the voltages across the sensing resistors R1 and R2. On the other hand, constant current circuits 33 (constant current circuits 33m and 33m+1 are shown in FIG. 5) are disposed at one end of each read word line 6.

In this magnetic memory device, to read the information stored in a desired storage cell 1, the read circuit 23 corresponding to the read bit line 5 connected to the desired storage cell 1 is operated by applying a predetermined voltage from a Y direction address decoder circuit 22 to a bit decode line Y (for example, a bit decode line Yn) connected to that read circuit 23 to switch ON the transistors Q1 and Q2 of the read circuit 23. The constant current circuit 33 corresponding to the read word line 6 connected to the desired storage cell 1 is operated by applying a predetermined voltage to a word decode line (for example, a word decode line Xm) connected to the constant current circuit 33. In this state, the power supply voltage Vcc is applied via the sensing resistors R1 and R2 of the operated read circuit 23 to one end of the lines 5a and 5b that construct the read bit line 5 connected to the desired storage cell 1. On the other hand, one end of the read word line 6 connected to the desired storage cell 1 is connected to a voltage that is close to ground potential by the operated constant current circuit 33. By doing so, a current Ib1 flows through one magnetoresistive effect revealing body 2a in the desired storage cell 1 on a path composed of the sensing resistance R1, the transistor Q1, the diode Da, the magnetoresistive effect revealing body 2a, the read word line 6, and the constant current circuit 33 and a current Ib2 flows through the other magnetoresistive effect revealing body 2b in the desired storage cell 1 on a path composed of the sensing resistance R2, the transistor Q2, the diode Db, the magnetoresistive effect revealing body 2b, the read word line 6, and the constant current circuit 33.

Since the values of the currents Ib1 and Ib2 are controlled by the constant current circuit 33 so that the total of the currents is constant, based on whether the resistance of one of the magnetoresistive effect revealing bodies 2a and 2b is larger than the resistance of the other, one of the currents Ib1 and Ib2 will be larger than the other or smaller than the other. As the currents Ib1 and Ib2 change, the voltages across the sensing resistors R1 and R2 also change. Accordingly, by amplifying the difference in the voltages across the sensing resistors R1 and R2, the differential amplifier circuit 42 of the read circuit 23 reads and outputs the information stored in the desired storage cell 1.

SUMMARY OF THE INVENTION

However, by investigating the conventional magnetic memory device described above, the present inventors found the following problem to be solved. Since the other ends of the read bit lines 5 and the read word lines 6 are open in the magnetic memory device described above, the read bit lines 5 and the read word lines 6 aside from the single read bit line 5 (a single pair of lines) and the single read word line 6 connected to the storage cell 1 from which information is being read are placed in a near-floating state (a floating state is where there is high impedance that is not fixed at a particular potential). This means that when a read word line 6 changes to a selected state where information is read from a storage cell 1 on that read word line 6 (i.e., when the voltage of the read word line 6 changes from a threshold voltage Vth to a "slow level" (a voltage level close to ground potential)), charge that has accumulated in the parasitic capacitance present between the read word line 6 and ground is rapidly discharged by the operating constant current circuit 33, and as a result the change of the voltage from the threshold voltage Vth to the "low level" is completed in a short time, as shown in FIG. 6. However, when the read word line 6 changes to a non-selected state after the read of information from the storage cell 1 has been completed (i.e., when the voltage of the read word line 6 changes from the threshold voltage Vth to a "high level"), it is necessary to charge the parasitic capacitance described above using a current supplied from the power supply Vcc via the storage cell 1 and the read circuit 23, and as shown by the broken line in FIG. 6, compared to when the read word line 6 changes to the low level, an extremely long time is required. Accordingly, there is the problem that the time taken before it is possible to read information from the next storage cell 1 increases due to the time required for such charging. Here, the expression "high level" refers to a voltage produced by subtracting a voltage between the base and emitter of the bipolar transistor Q1 (Q2) from the voltage V2 applied to the bit decode line Y.

On the other hand, the read bit lines 5 are connected to the read word lines 6 via the magnetoresistive effect revealing bodies 2a, 2b and the diodes Da and Db of the storage cells 1. This means that the voltage of the read bit lines 5 (i.e., the read bit lines 5 in the non-selected state) aside from the single read bit line 5 connected to an operating read circuit 23 (i.e., the read bit line 5 in the selected state) is lowered (i.e., is pulled down) via the single read word line 6 in the selected state to a voltage close to the ground potential. As a result, when the power supply voltage Vcc has been applied from a read circuit 23 via the sensing resistors R1 and R2 (i.e., after a read bit line 5 has changed to the selected state), it is necessary to raise the voltage of the read bit line 5 while charging the parasitic capacitance present between the read bit line 5 and ground or the like from the voltage close to ground potential to the high level described above using the current that is supplied from the power supply voltage Vcc. This means that there is an increase in the time taken from the start of application of the power supply voltage Vcc until the voltage of the read bit line 5 rises to a voltage (the high level) that enables the currents Ib1 and Ib2 required to read information from the storage cell 1 to flow, resulting in the problem of more time being required to read information from a storage cell 1.

In particular, when the number of storage cells 1 connected to the read bit lines 5 and the read word lines 6 is increased in response to demands for increased storage capacity, if increases in the physical size of the magnetic memory device are not allowed, it will be necessary to make the read bit lines 5 and the read word lines 6 thinner and to dispose the read bit lines 5 and the read word lines 6 closer together, side by side, which increases the resistance and the parasitic capacitance of the read bit lines 5 and the read word lines 6. Accordingly, the above problems of a long time being required to return a read word line 6 from the selected state to the non-selected state and of more time being taken to raise the voltage of a read bit line 5 from the start of application of the power supply voltage Vcc to the voltage that enables the currents Ib1 and Ib2 required to read information from the storage cell 1 to flow become even more noticeable.

The present invention was conceived to solve the problems described above and it is a principal object of the present invention to provide a magnetic memory device that can read information at high speed.

A magnetic memory device according to the present invention includes: a plurality of storage cells disposed in two dimensions; read lines that supply a read current for reading information from a first power supply to the respective storage cells; and a second power supply that is connected to at least some of the read lines and applies an intermediate voltage, which is lower than a voltage supplied by the first power supply, to the connected read lines.

According to the above magnetic memory device, by applying the intermediate voltage, which is lower than the voltage supplied by the first power supply, from the second power supply via at least one of a resistor and a diode, for example, to the read lines that supply a read current for reading information to the storage cells from a first power supply, when for example a read line whose voltage has been lowered to a voltage close to ground potential in a selected state is switched to a non-selected state where the voltage of the read line is slightly higher than or substantially equal to the intermediate voltage, it is possible to charge a parasitic capacitance connected to the read line using the current from the second power supply. Since a read line can be switched from the selected state to the non-selected state in a short time, it is possible to reduce the time taken until the read line connected to the storage cell from which information is to be read next is switched to the selected state. On the other hand, since a read line that needs to switch to a higher voltage when switching from the non-selected state to the selected state has its voltage raised in the non-selected state to the intermediate voltage by the second power supply, when switching to the selected state, it is sufficient to raise the voltage from the intermediate voltage, and therefore the read line can be switched from the non-selected state to the selected state in a short time. This means that according to this magnetic memory device, it is possible to read information stored in storage cells at high speed even if the resistance and the parasitic capacitance of the read lines increase as the storage capacity increases.

The read lines may include a plurality of read bit lines disposed in parallel and a plurality of read word lines disposed in parallel so as to intersect with the plurality of read bit lines, the storage cells may be respectively disposed at or near intersections of the read bit lines and the read word lines and may be connected to the read bit lines and the read word lines, and the second power supply may apply the intermediate voltage to at least one of the plurality of read bit lines and the plurality of read word lines. According to this construction, the second power supply can apply the intermediate voltage to each line in at least one of the plurality of read bit lines and the plurality of read word lines via at least one of resistors and diodes, for example. Accordingly, with this magnetic memory device, when reading information from a desired storage cell, for example, in a construction where the read word line connected to the storage cell is switched to the selected state by lowering the voltage to a voltage close to ground potential and the read bit line connected to the storage cell is switched to the selected state by applying the power supply voltage, by applying the intermediate voltage to all of the read word lines in advance, it is possible to pull up the voltage of the read word lines connected to only the storage cells from which information is not being read to the intermediate voltage in advance (i.e., it is possible to switch such read word lines to the non-selected state in advance). Also, when switching a read word line in the selected state to the non-selected state, the parasitic capacitance connected to the read word line can be rapidly charged to the intermediate voltage by the current from the second power supply. On the other hand, by applying the intermediate voltage to all of the read bit lines in advance, it is possible to pull up the voltage of the read bit lines connected to only storage cells from which information is not being read to the intermediate voltage within a voltage range of a non-selected state in advance. This means that when a read bit line in the non-selected state is switched to the selected state, the charging of the parasitic capacitance connected to the read bit line can be started from the intermediate voltage. Accordingly, even if the resistance and/or the parasitic capacitance of the read word lines and the read bit lines is/are large, a read word line can be switched to the non-selected state in a short time and a read bit line can be switched to the selected state in a short time, and therefore the information stored in the storage cells can be read at high speed.

The second power supply may be connected to the read lines via parallel circuits each composed of a resistor and a diode. In this case, the resistance of the parallel circuits should preferably be set in a range of 500 Ω to 10 KΩ, inclusive. According to this construction, even if the difference in potential between the voltage of read lines and the intermediate voltage is large, since the intermediate voltage can be applied from the second power supply via the diodes, the read lines in the non-selected state can be switched to the intermediate voltage in an extremely short time. Accordingly, the information stored in the storage cells can be read even faster.

In addition, the intermediate voltage may be set at a voltage that is at least a characteristic potential barrier of a semiconductor pn junction lower than the voltage supplied by the first power supply. With this construction, in a state where the intermediate voltage is being applied, by using a semiconductor switch element such as a bipolar transistor or a field effect transistor, it is possible to have a read line switch between a selected state and a non-selected state as desired.

It should be noted that the disclosure of the present invention relates to a content of Japanese Patent Application 2005-214151 that was filed on 25 Jul. 2005, the entire content of which is herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a magnetic memory device according to the present invention will now be described with reference to the attached drawings.

First, the construction of the magnetic memory device according to the present invention will be described with reference to FIGS. 1 and 2.

Figure 1:
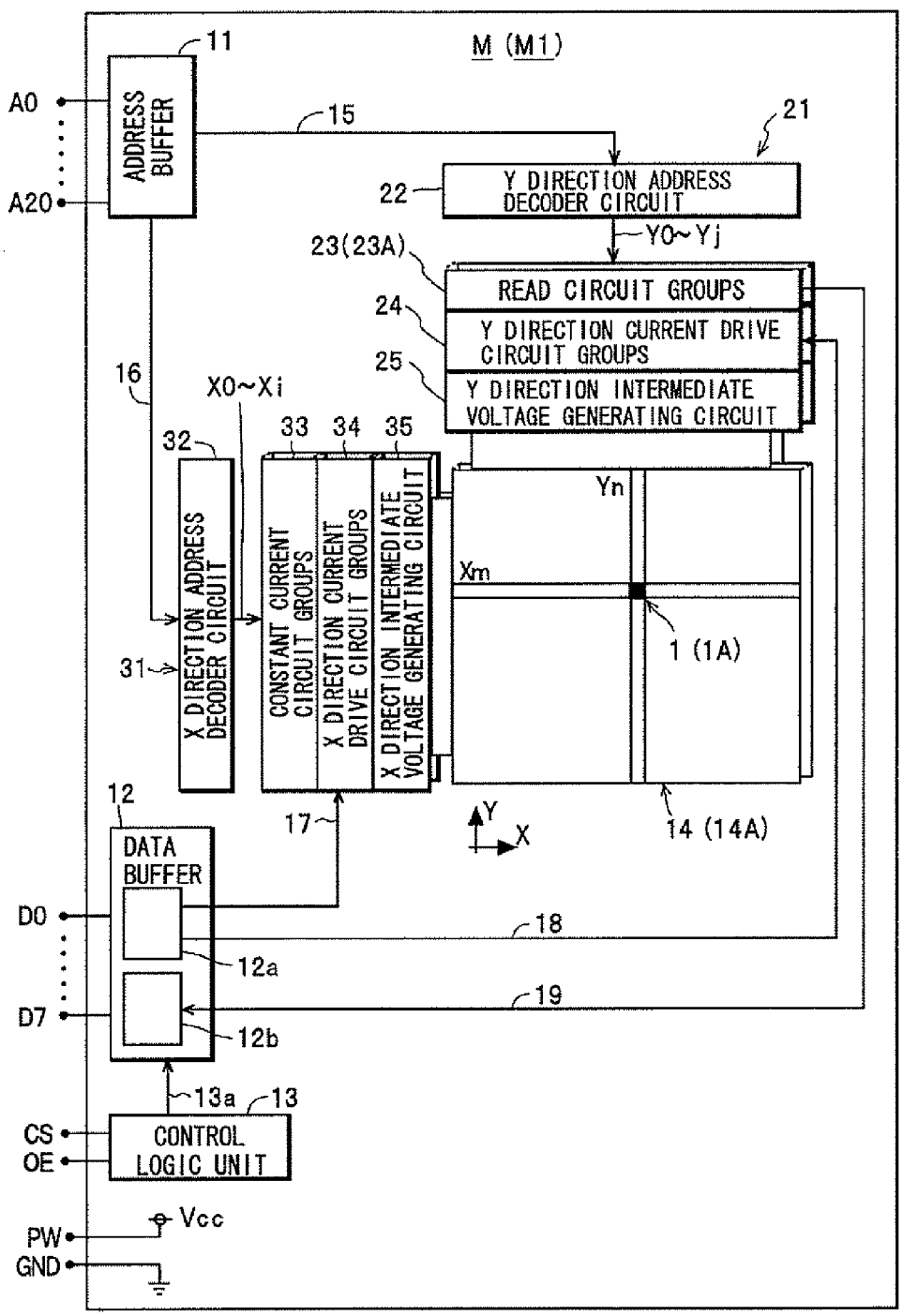
FIG. 1 is a block diagram showing the entire construction of a magnetic memory device.

As shown in FIG. 1, a magnetic memory device M includes an address buffer 11, a data buffer 12, a control logic unit 13, storage cell groups 14, a Y direction driving control circuit 21, and an X direction driving control circuit 31. The Y direction driving control circuit 21 includes a Y direction address decoder circuit 22, read circuit groups 23, Y direction current drive circuit groups 24, and Y direction intermediate voltage generating circuits 25. On the other hand, the X direction driving control circuit 31 includes an X direction address decoder circuit 32, constant current circuit groups 33, X direction current drive circuit groups 34, and X direction intermediate voltage generating circuits 35. In this magnetic memory device M, one storage cell group 14, one read circuit group 23, one Y direction current drive circuit group 24, one Y direction intermediate voltage generating circuit 25, one constant current circuit group 33, one X direction current drive circuit group 34, and one X direction intermediate voltage generating circuit 35 are provided for each bit in the number of bits (in the present embodiment, eight, for example) that construct data (i.e., data inputted via the data buffer 12). The magnetic memory device M is constructed so that when predetermined data is stored at a predetermined address specified by an address inputted via the address buffer 11, information (i.e., "1" or "0") of the respective bits constructing the predetermined data is stored in the storage cells 1 with the predetermined address in the storage cell groups 14 that correspond to the respective bits. The respective component elements included in the magnetic memory device M operate on a power supply voltage Vcc supplied from a DC voltage supply (a "first power supply" for the present invention) between a power supply terminal PW and a ground terminal GND.

Here, the address buffer 11 includes external address input terminals A0 to A20. Address signals (for example, upper-bit address signals out of the address signals) obtained via the external address input terminals A0 to A20 are outputted to the Y direction address decoder circuit 22 via a Y direction address bus 15 and other address signals (for example, lower-bit address signals out of the address signals) is outputted to the X direction address decoder circuit 32 via an X direction address bus 16.

The data buffer 12 includes external data terminals D0 to D7, an input buffer 12*a*, and an output buffer 12*b*. The data buffer 12 is connected via a control signal line 13*a* to the control logic unit 13. The input buffer 12*a* is connected via an X direction write data bus 17 to the X direction current drive circuit groups 34 and is connected via a Y direction write data bus 18 to the Y direction current drive circuit groups 24. To store information of the respective bits included in the data inputted via the external data terminals D0 to D7 in the storage cell groups 14 in the eight storage cell groups 14 that correspond to information of the respective bits, the information on the respective bits is outputted to the X direction current drive circuit groups 34 and the Y direction current drive circuit groups 24 that correspond to the respective bits. On the other hand, the output buffer 12*b* is connected via a Y direction read data bus 19 to the read circuit groups 23. The output buffer 12*b* inputs data read by the read circuit groups 23 via the Y direction read data bus 19 and outputs the inputted data to the external data terminals D0 to D7. The input buffer 12*a* and the output buffer 12*b* operate according to a control signal inputted from the control logic unit 13 via the control signal line 13*a*.

The control logic unit 13 includes an input terminal CS and an input terminal OE and controls operations of the data buffer 12, the read circuit groups 23, the Y direction current drive circuit groups 24 and the X direction current drive circuit groups 34. More specifically, the control logic unit 13 decides whether to activate one of the input buffer 12*a* and the output buffer 12*b* based on a chip select signal inputted via the input terminal CS and an output enable signal inputted via the input terminal OE, generates a control signal that causes the input buffer 12a and the output buffer 12b to operate based on such decision, and outputs the control signal to the data buffer 12 via the control signal line 13a.

Each storage cell group 14 includes a plurality (j+1, where j is an integer of one or greater) of write bit lines (not shown) that are each composed of a pair of lines that are disposed in parallel and disposed in the X direction in FIG. 1, a plurality (i+1, where i is an integer of one or greater) of write word lines (not shown) that are disposed in the Y direction in FIG. 1 so as to intersect with (be perpendicular to) the respective lines of the write bit lines, a plurality ((i+1)×(j+1)) of storage cells (magnetic storage cells) 1 disposed in a two-dimensional arrangement (as one example, a matrix-like arrangement with (i+1) rows and (j+1) columns) produced by disposing the storage cells at intersections between the write bit lines and the write word lines (or near such intersections), a plurality (j+1) of read bit lines 5 (see FIG. 2) that are each composed of a pair of lines 5a and 5b that are disposed in parallel and disposed in parallel with the write bit lines, and a plurality (i+1) of read word lines 6 that are disposed in parallel with the write word lines. The read bit lines 5 and the read word lines 6 construct the "read lines" for the present invention.

Figure 2:
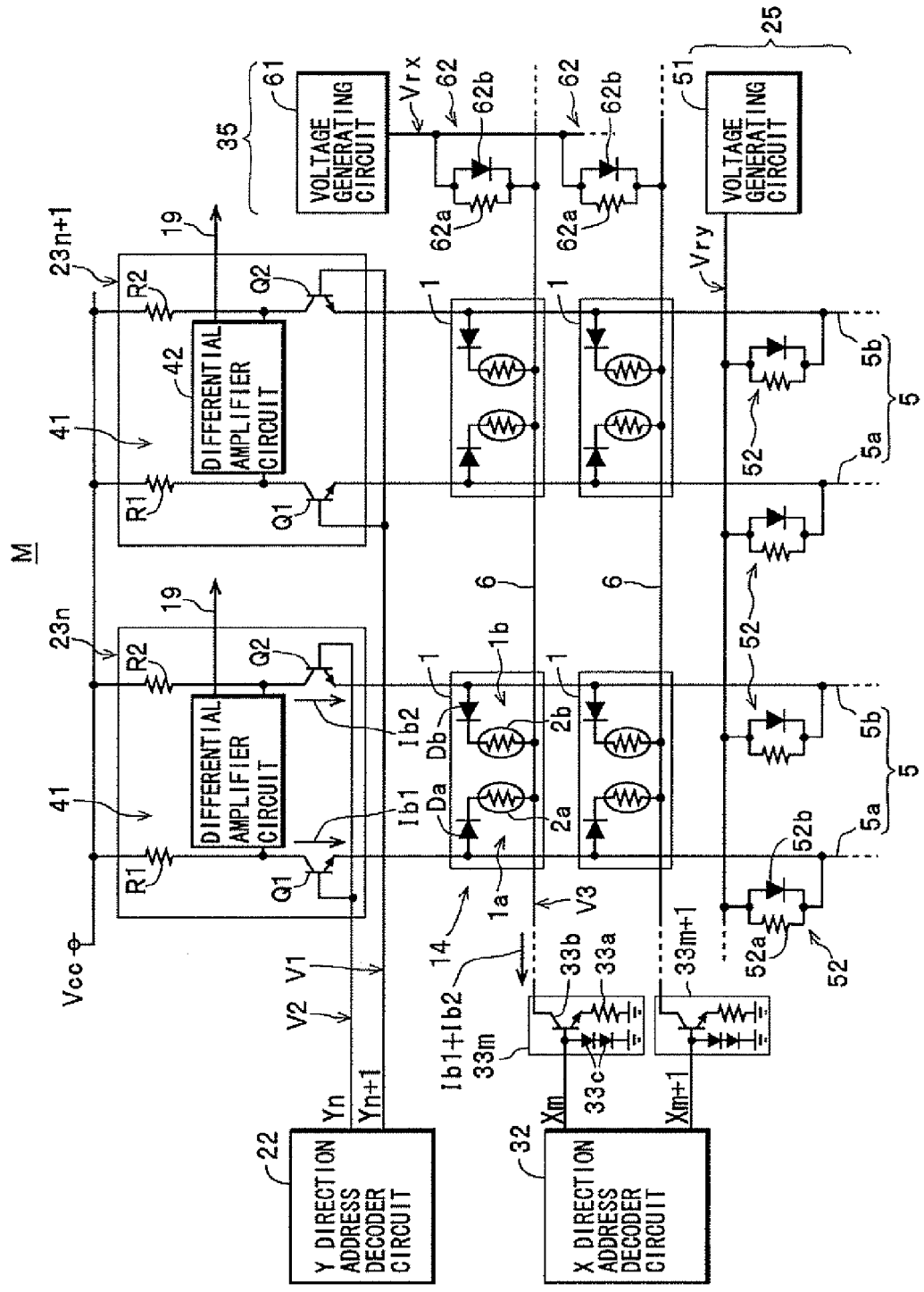
FIG. 2 is a circuit diagram showing the construction of circuits related to reading information in the magnetic memory device.

As shown in FIG. 2, the respective storage cells 1 include a pair of storage elements 1a and 1b. The storage elements 1a and 1b include magnetoresistive effect revealing bodies 2a and 2b constructed using GMR or TMR structures and two unidirectional elements (for example, diodes Da and Db) connected in series to the magnetoresistive effect revealing bodies 2a and 2b respectively. By changing to one of a state where the resistance of the magnetoresistive effect revealing body 2a is smaller than the resistance of the magnetoresistive effect revealing body 2b and a state where the resistance of the magnetoresistive effect revealing body 2a is larger than the resistance of the magnetoresistive effect revealing body 2b in accordance with the direction of a synthetic magnetic field produced due to currents supplied to the write bit lines and the write word lines, information of the respective bits that construct the data is stored in the storage elements 1a and 1b. The anode terminals of the diodes Da and Db are connected to the lines 5a and 5b respectively of the read bit lines 5. The cathode terminal of the diode Da is connected to a read word line 6 via one of the magnetoresistive effect revealing bodies (the magnetoresistive effect revealing body 2a) and the cathode terminal of the diode Db is connected to the same read word line 6 via the other of the magnetoresistive effect revealing bodies (the magnetoresistive effect revealing body 2b). Note that since the diodes Da and Db only need to restrict the direction of the current flowing through the magnetoresistive effect revealing bodies 2a and 2b (the currents Ib1 and Ib2 described later, referred to as the "read currents" for the present invention) to the direction from the read bit lines 5 to the read word lines 6, it is possible to use a construction where the positions of the magnetoresistive effect revealing body 2a and the diode Da are interchanged, the positions of the magnetoresistive effect revealing body 2b and the diode Db are interchanged, and the diodes Da and Db are connected to the read word lines 6.

Based on the address signals inputted via the Y direction address bus 15, the Y direction address decoder circuit 22 of the Y direction driving control circuit 21 selects one bit decode line (a bit decode line Yn where n is an integer of 0 to j, inclusive) out of the (j+1) bit decode lines Y0, . . . , Yn, . . . , Yj connected to the (j+1) Y direction current drive circuits included in the Y direction current drive circuit group 24 and to the (j+1) read circuits included in the read circuit group 23, and raises the voltage of the selected bit decode line Yn from V1 to V2 (i.e., the Y direction address decoder circuit 22 applies the voltage V2 to the bit decode line Yn). Note that in the present embodiment, the voltage V2 is set at a voltage that is substantially equal to the power supply voltage Vcc, for example, and the voltage V1 is set at a voltage that is sufficiently lower than the voltage V2.

As shown in FIG. 2, the read circuits (the read circuit 23n is described below as a representative example) each include a voltage applying circuit 41 and a differential amplifier circuit 42. The voltage applying circuit 41 is disposed between the power supply line of the power supply voltage Vcc and the lines 5a and 5b of the read bit lines 5 that are connected to the (i+1) storage cells 1 included on the n-th column of the storage cell group 14. The differential amplifier circuit 42 is constructed so as to be able to read information from a storage cell 1 by detecting the difference between the currents Ib1 and Ib2 that flow on the lines 5a and 5b when the power supply voltage Vcc is applied. More specifically, the voltage applying circuit 41 includes two resistors (sensing resistors) R1 and R2 for current-voltage conversion to which the power supply voltage Vcc is applied at one end and two switch elements (as one example, NPN bipolar transistors) Q1 and Q2 whose collector terminals are connected to the other ends of the corresponding resistors R1 and R2 respectively and whose emitter terminals are connected to one ends of the corresponding lines 5a and 5b respectively. The resistances of the resistors R1 and R2 are the same and are set at resistances that are sufficiently greater (resistance values that are double or greater) than the resistances of the magnetoresistive effect revealing bodies 2a and 2b in high-resistance states described later. The differential amplifier circuit 42 detects the difference between the currents Ib1 and Ib2, and more specifically the difference in potential between the voltages (sensing voltages) across both ends of the resistors R1 and R2 due to the currents Ib1 and Ib2 and amplifies and outputs the difference. Since the transistors Q1 and Q2 switch to an OFF state when the voltage of the bit decode line Yn is voltage V1, the voltage applying circuit 41 and the differential amplifier circuit 42 of the read circuit 23n constructed as described above stop operating and the read circuit 23n switches to a non-operating state. On the other hand, when the voltage of the bit decode line Yn is voltage V2, the transistors Q1 and Q2 switch to the ON state, the voltage applying circuit 41 and the differential amplifier circuit 42 start operating, and the read circuit 23n switches to an operating state. As a result of the transistors Q1 and Q2 being in the ON state during the operating state of the read circuit 23n, the voltage ($V2-V_{BE}$) is applied to the lines 5a and 5b of the read bit line 5. On the other hand, when the read circuit 23n is in the non-operating state, the transistors Q1 and Q2 are in the OFF state, resulting in the lines 5a and 5b of the read bit line 5 changing to a state close to the floating state. Note that $V_{BE}$ is the forward voltage between the base and emitter of the transistors Q1 and Q2 (i.e., the characteristic potential barrier of the semiconductor pn junction).

The Y direction current drive circuit connected to the bit decode line Yn selected out of the (j+1) Y direction current drive circuits included in the Y direction current drive circuit group 24 operates when the predetermined voltage V2 described above is applied via the bit decode line Yn, supplies a write current to the write bit line connected to that Y direction current drive circuit, stops operating when the predetermined voltage V1 described above is applied via the bit decode line Yn, and stops the supplying of the write current to the write bit line connected to that Y direction current drive circuit.

As shown in FIG. 2, the Y direction intermediate voltage generating circuit 25 includes a voltage generating circuit 51 that generates an intermediate voltage Vry and (j+1) parallel circuits 52 that are each constructed of a resistor 52a and a diode 52b connected in parallel. The voltage generating circuit 51 functions as a "second power supply" for the present invention and constantly supplies the intermediate voltage Vry via the parallel circuits 52 to pairs of the lines 5a and 5b (for example, other ends of the lines 5a and 5b) that construct the read bit lines 5. The intermediate voltage Vry is set at a desired voltage in a voltage range from a voltage (referred to here as the "low voltage") that is slightly higher than the voltage $(V1-V_{BE})$ to a voltage (referred to here as the "high voltage") that is slightly lower than the voltage $(V2-V_{BE})$. The intermediate voltage Vry should preferably be set equal to the voltage $(V1-V_{BE})$ or slightly higher. More specifically, in the present embodiment, the intermediate voltage Vry is set equal to the voltage $(V1-V_{BE})$. The resistance of the resistors 52a is set in a range of 500Ω to 10 KΩ, inclusive. To minimize the effects of the respective read bit lines 5 on each other, this resistance needs to be set at a value of a certain magnitude or higher, but since it is necessary to forcibly set the (non-selected) read bit lines 5 that are not being used to read a storage cell 1 at the intermediate voltage Vry, a resistance of several hundred KΩ is too high. For this reason, the resistance should preferably be set in the range given above. In the present embodiment, the resistance of the resistors 52a is set at 5 KΩ, for example.

On the other hand, based on the address signals inputted via the X direction address bus 16, the X direction address decoder circuit 32 of the X direction driving control circuit 31 selects one word decode line (a word decode line Xm where m is an integer of 0 to I, inclusive) out of the (i+1) word decode lines X0, . . . , Xm, . . . , Xi connected to the (i+1) X direction current drive circuits included in the X direction current drive circuit group 34 and to the (i+1) constant current circuits included in the constant current circuit group 33, and applies a predetermined voltage to the selected word decode line Xm.

As shown in FIG. 2, the respective constant current circuits 33 (the constant current circuit 33m connected to the word decode line Xm is described below as a representative example) includes a transistor 33b whose collector terminal is connected to one end of a read word line 6 and whose emitter terminal is connected via a resistor 33a to ground and two diodes 33c that are connected in series between the base terminal of the transistor 33b and ground and keep the base voltage constant when a predetermined voltage is applied via the word decode line Xm. The constant current circuit 33m operates when the predetermined voltage described above is applied via the word decode line Xm and by lowering the voltage of the connected read word line 6 to a voltage V3 close to ground potential, starts having the currents Ib1 and Ib2 supplied from the read bit lines 5 to the magnetoresistive effect revealing bodies 2a and 2b of a storage cell 1 and passes the currents Ib1 and Ib2 supplied to the read word line 6 via the magnetoresistive effect revealing bodies 2a and 2b to ground to keep the current flowing on the read word line 6 (i.e., the total of the currents Ib1 and Ib2 flowing through the magnetoresistive effect revealing bodies 2a and 2b) constant. Note that in reality, aside from the currents Ib1 and Ib2, a current supplied from the Y direction intermediate voltage generating circuit 25 and the X direction intermediate voltage generating circuit 35 also pass via the read word line 6 and the constant current circuit 33m to ground, but such currents have been ignored for ease of understanding the present invention. On the other hand, the constant current circuit 33m switches to a non-operating state when the predetermined voltage is not applied via the word decode line Xm, resulting in the read word line 6 changing to a state close to the floating state.

The X direction current drive circuit connected to the word decode line Xm selected out of the (i+1) X direction current drive circuits included in the X direction current drive circuit group 34 operates when the predetermined voltage described above is applied via the word decode line Xm, supplies a write current to the write word line connected to that X direction current drive circuit, stops operating when the predetermined voltage described above is not applied via the word decode line Xm, and stops the supplying of the write current to the write word line connected to that X direction current drive circuit.

As shown in FIG. 2, the X direction intermediate voltage generating circuit 35 includes a voltage generating circuit 61 that generates an intermediate voltage Vrx and (i+1) parallel circuits 62 that are each constructed of a resistor 62a and a diode 62b connected in parallel. The voltage generating circuit 61 functions as another "second power supply" for the present invention and constantly supplies the intermediate voltage Vrx via the parallel circuits 62 to the read word lines 6 (for example, other ends of the read word lines 6). Like the intermediate voltage Vry, the intermediate voltage Vrx is set at a desired voltage in a voltage range from a voltage (referred to here as the "low voltage") that is slightly higher than the voltage $(V1-V_{BE})$ to a voltage (referred to here as the "high voltage") that is slightly lower than the voltage $(V2-V_{BE})$, inclusive. The intermediate voltage Vrx is set at a higher voltage than the threshold voltage Vth when the read word line 6 switches from the non-selected state to the selected state. Like the resistors 52a, the resistance of the resistors 62a is set in a range of 500Ω to 10 KΩ, inclusive. In the present embodiment, the resistance of the resistors 62a is set at 2 KΩ, for example.

Next, a read operation for information in the magnetic memory device M will be described. As one example, a read operation for information from a storage cell 1 disposed at the intersection between the read bit lines 5 connected to the read circuit 23n and the read word line 6 connected to the constant current circuit 33m will be described. Note that in the magnetic memory device M, it is assumed that information has been stored in advance by operating the Y direction current drive circuit groups 24 and the X direction current drive circuit groups 34.

First, the address buffer 11 outputs address signals inputted via external address input terminals A0 to A20 via the X direction address bus 16 and the Y direction address bus 15 to the X direction address decoder circuit 32 and the Y direction address decoder circuit 22. At this time, the Y direction address decoder circuit 22 selects one out of the bit decode lines Y0 to Yj (as one example, the bit decode line Yn) based on the inputted address signals. In the same way, the X direction address decoder circuit 32 selects one out of the word decode lines X0 to Xi (as one example, the word decode line Xm) based on the inputted address signals. On the other hand, in the data buffer 12, in accordance with a control signal outputted from the control signal line 13a, the output buffer 12b switches to an operating state and the input buffer 12a switches to a non-operating state, Here, in the read circuits 23n of the storage cell groups 14 selected by the bit decode line Yn, by raising the voltage of the bit decode line Yn from V1 to V2, the voltage applying circuit 41 and the differential amplifier circuit 42 switch to the operating state. As shown in FIG. 2, the operating voltage applying circuit 41 starts applying the power supply voltage Vcc to the lines 5a and 5b of the read bit lines 5 connected to (i+1) storage cells 1 included in the n-th column of the storage cell group 14. In the non-selected state, all of the read bit lines 5 are raised in advance to the intermediate voltage Vry by the Y direction intermediate voltage generating circuit 25. Accordingly, since the read circuit 23n only needs to raise the voltages of the lines 5a and 5b from the intermediate voltage Vry to the voltage (V2–$V_{BE}$), even if the resistance and/or the parasitic capacitance of the read bit lines 5 (the lines 5a, 5b) is/are large, the parasitic capacitance is rapidly charged within a short time following the switch to the operating state and the potential of the read bit lines 5 is raised to the voltage (V2–$V_{BE}$) (i.e., the read bit lines 5 are switched to the selected state). Note that when the potential difference between the voltage of the read bit line 5 and the intermediate voltage Vry is large, the pulling up of the voltage of the lines 5a and 5b to the intermediate voltage Vry by the Y direction intermediate voltage generating circuit 25 is carried out mainly via one of the diodes 52b, and therefore the voltages of the lines 5a and 5b are pulled up to the intermediate voltage Vry in a short time.

Figure 6:
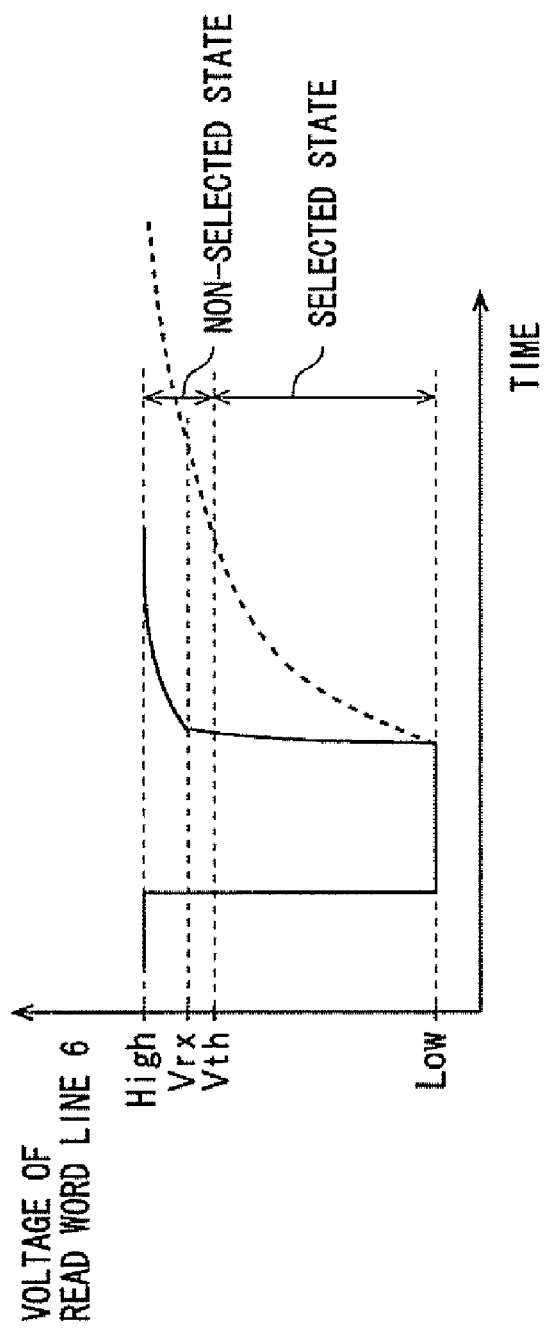
FIG. 6 is a voltage waveform diagram showing the voltage applied to a read word line.

The constant current circuit 33m of each storage cell group 14 selected by the word decode line Xm switches to the operating state due to the predetermined voltage being applied via the word decode line Xm. By doing so, the read word line 6 connected to each constant current circuit 33m that has switched to the operating state is immediately pulled down to a voltage close to ground potential (i.e., the read word line 6 changes to the selected state). Since the intermediate voltage Vrx is constantly applied to all of the read word lines 6 via the X direction intermediate voltage generating circuit 35, the voltage of all of the read word lines 6 in the non-selected state is pulled up to the intermediate voltage Vrx in advance. Note that when the potential difference between the voltage of the read word line 6 and the intermediate voltage Vrx is large, the pulling up of the voltage of the read word line 6 to the intermediate voltage Vrx by the X direction intermediate voltage generating circuit 35 is carried out mainly via one of the diodes 62b, and therefore the voltage of the read word line 6 is pulled up to the intermediate voltage Vrx in a short time as shown by the solid line in FIG. 6. Accordingly, the read word line 6 can change from the selected state to the non-selected state in a short time.

By doing so, as shown in FIG. 2, the currents Ib1 and Ib2 whose values are inversely proportionate to the resistance values of the magnetoresistive effect revealing bodies 2a and 2b of a desired storage cell 1 pass to ground via the power supply voltage Vcc, the read circuit 23n, the read bit lines 5 (the lines 5a and 5b), the storage cell 1, the read word line 6, and the constant current circuit 33m. The total of the currents Ib1 and Ib2 is kept constant by the constant current circuit 33m. This means that out of the magnetoresistive effect revealing bodies 2a and 2b, when the resistance of the magnetoresistive effect revealing body 2a is higher than the resistance of the magnetoresistive effect revealing body 2b, the current Ib2 will always be higher than the current Ib1. On the other hand, when the resistance of the magnetoresistive effect revealing body 2a is lower than the resistance of the magnetoresistive effect revealing body 2b, the current Ib2 will always be lower than the current Ib1.

By detecting the difference in voltages across both ends of the resistors R1 and R2 (the difference between currents Ib1 and Ib2) based on the currents Ib1 and Ib2, the differential amplifier circuit 42 of each read circuit 23n obtains the information (binary information) stored in the storage cell 1 and outputs the information to the Y direction read data bus 19. Next, the output buffer 12b outputs the data inputted via the Y direction read data bus 19 to the external data terminals D0 to D7. By doing so, reading of the data stored in the storage cells 1 is completed.

Next, when reading information from a storage cell 1 disposed at the intersection between the read bit line 5 connected to the read circuit 23n+1 and the read word line 6 connected to the constant current circuit 33m+1, based on the inputted address signals, the Y direction address decoder circuit 22 selects the bit decode line Yn+1 in place of the bit decode line Yn and based on the inputted address signals, the X direction address decoder circuit 32 selects the word decode line Xm+1 in place of the word decode line Xm. Since the transistors Q1, Q2 included in the read circuit 23n switch to the OFF state, the read bit line 5 connected to the read circuit 23n is cut off from the read circuit 23n. At this time, the voltage of the read bit line 5 connected to the read circuit 23n is pulled down to a voltage determined by the voltage (a voltage close to ground potential) of the read word line 6 connected to the constant current circuit 33m+1 (i.e., the read word line 6 that has changed to the selected state) and the intermediate voltage Vry (i.e., the read bit line 5 connected to the read circuit 23n is changed to the non-selected state). On the other hand, the voltage of the read bit line 5 connected to the read circuit 23n+1 is pulled up from the intermediate voltage Vry to the voltage (V2–$V_{BE}$) by the read circuit 23n+1 (i.e., the read bit line 5 connected to the read circuit 23n+1 is changed to the selected state).

The constant current circuit 33m changes to the non-selected state, and as a result the read word line 6 connected to the constant current circuit 33m is cut off from the voltage close to the ground potential and the voltage of the read word line 6 is pulled up by the X direction intermediate voltage generating circuit 35 to the intermediate voltage Vrx. In the X direction intermediate voltage generating circuit 35, since the voltage generating circuit 61 supplies the intermediate voltage Vrx to the read word lines 6 via the diodes 62b of the parallel circuits 62, the voltage of the read word line 6 connected to the constant current circuit 33m is pulled up to the intermediate voltage Vrx in a short time (i.e., the read word line 6 changes to the non-selected state in a short time). On the other hand, the voltage of the read word line 6 connected to the constant current circuit 33m+1 is rapidly pulled down to the voltage close to ground potential by the constant current circuit 33m+1 (i.e., the read word line 6 rapidly changes to the selected state). By doing so, since the currents Ib1 and Ib2 from the read bit line 5 connected to the read circuit 23n+1 flow via the desired storage cell 1 to the read word line 6 connected to the constant current circuit 33m+1, in the same way as the read operation for information described above from the storage cell 1 disposed at the intersection of the read bit line 5 connected to the read circuit 23n and the read word line 6 connected to the constant current circuit 33m, the read circuit 23n+1 reads the data stored in the desired storage cell 1.

In this way, in the magnetic memory device M, by constantly applying the intermediate voltage Vry from the Y direction intermediate voltage generating circuit 25 to the read bit lines 5, it is possible to pull up the voltage of all of the read bit lines 5 in the non-selected state in advance to the intermediate voltage Vry. This means that even if the resistance and/or the parasitic capacitance of the read bit line 5 is/are large, the read circuit 23 selected by the bit decode line Y only needs to raise the voltage of the parasitic capacitance that has already been charged to the intermediate voltage Vry to the voltage (V2-$V_{BE}$), and therefore the selected read circuit 23 can pull up the voltage of the read bit line 5 to the voltage (V2-$V_{BE}$) to switch the read bit line 5 to the selected state in a short time after the read circuit 23 changes to the operating state. In the same way, in the magnetic memory device M, by constantly applying the intermediate voltage Vrx via the X direction intermediate voltage generating circuit 35 to the read word lines 6, the voltage of all of the read word lines 6 in the non-selected state can be pulled up in advance to the intermediate voltage Vrx. In addition, the voltage of the read word line 6 connected to the storage cell 1 from which information has just been read (i.e., the voltage of the read word line 6 that was in the selected state), can be raised by the X direction intermediate voltage generating circuit 35 from the voltage close to the ground potential to the intermediate voltage Vrx in a short time to change the read word line 6 to the non-selected state. This means that according to the magnetic memory device X, after a read circuit 23 is selected by the bit decode line Y and the constant current circuit 33 is selected by the word decode line X, it is possible to immediately supply the currents Ib1 and Ib2 to the desired storage cell 1 connected to the read bit line 5 connected to the selected read circuit 23 and the read word line 6 connected to the selected constant current circuit 33, and as a result, it is possible to read the information stored in the storage cell 1 at high speed.

The voltage generating circuit 51 applies the intermediate voltage Vry to the read bit lines 5 via the parallel circuits 52 constructed of the resistors 52*a* and the diodes 52*b* and the voltage generating circuit 61 applies the intermediate voltage Vrx to the read word lines 6 via the parallel circuits 62 constructed of the resistors 62*a* and the diodes 62*b*, and therefore even if the difference between the intermediate voltage Vry and the voltage of the read bit lines 5 and the difference between the intermediate voltage Vrx and the voltage of the read word lines 6 are large, since the voltages are applied via the diodes 52*b* and 62*b*, the voltages of the read bit lines 5 and the read word lines 6 in the non-selected state can be respectively changed to the intermediate voltages Vry and Vrx in an extremely short time. Accordingly, it is possible to read the information stored in a storage cell 1 much faster.

Figure 3:
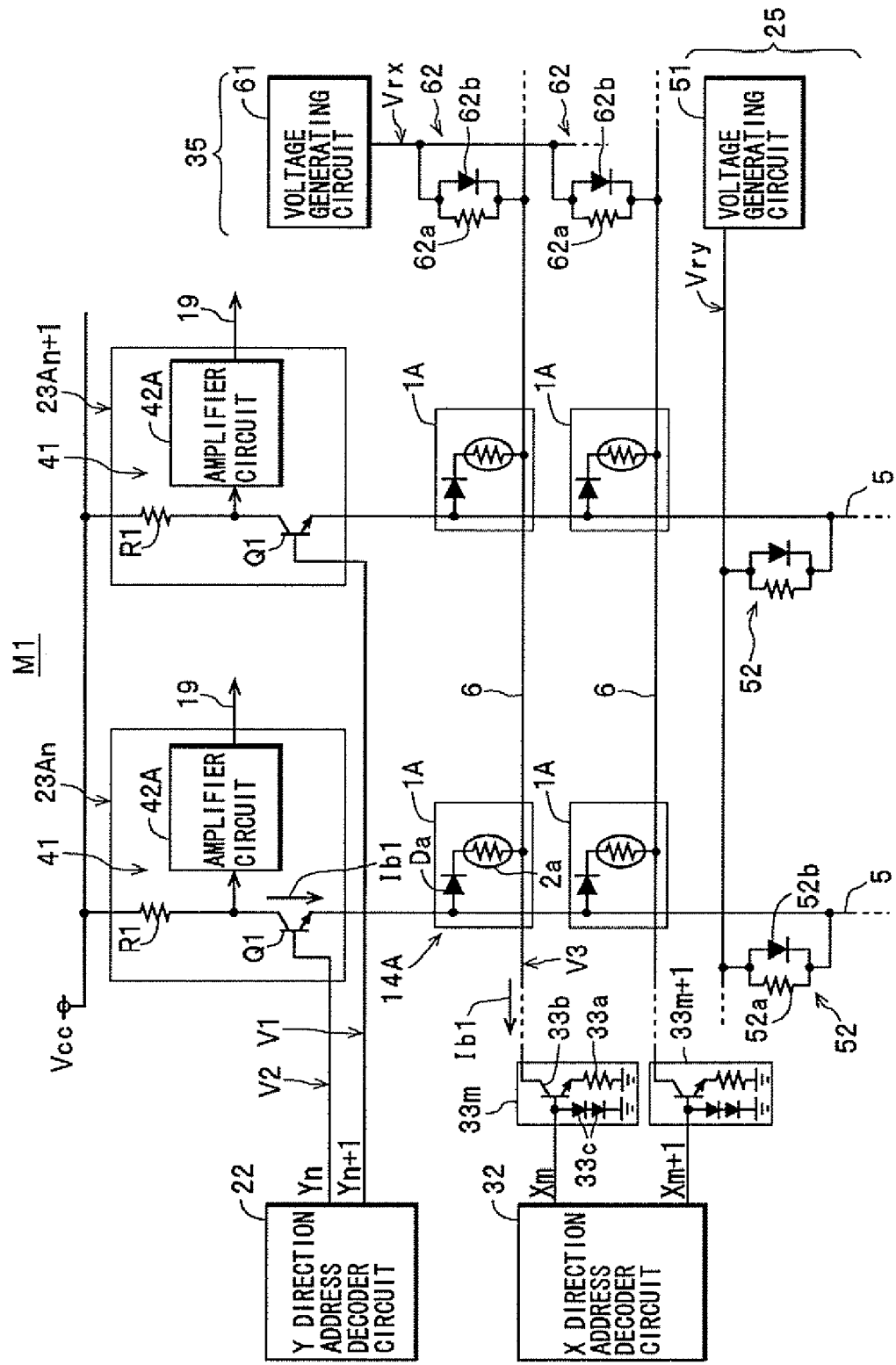
FIG. 3 is a circuit diagram showing the construction of circuits related to reading information in another magnetic memory device.

Note that the present invention is not limited to the construction described above. For example, although the intermediate voltage Vry and the intermediate voltage Vrx are applied to both the read bit lines 5 and the read word lines 6 from the Y direction intermediate voltage generating circuit 25 and the X direction intermediate voltage generating circuit 35, it is possible to use a construction where an intermediate voltage is applied to only one of the read bit lines 5 and the read word lines 6. Also, although an example where each storage cell 1 is constructed of two magnetoresistive effect revealing bodies 2*a* and 2*b* has been described, as shown in FIG. 1, it should be obvious that the present invention can also be applied to a magnetic memory device M1 where each storage cell 1A is constructed of one magnetoresistive effect revealing body 2*a*. The magnetic memory device M1 is based on the construction of the magnetic memory device M described above, and as shown in FIG. 3 can be realized by replacing the read circuits of the magnetic memory device M that include two series of circuits of the same construction with read circuits 23A (in FIG. 3, read circuits 23A*n* and 23A*n*+1 are shown) that each include one such series and an amplifier circuit 42A in place of the differential amplifier circuit 42. Note that with the magnetic memory device M1, aside from the construction described above and the construction of the storage cells 1A of the storage cell groups 14A for storing one piece of information in one bit, the basic construction and operation are the same as the magnetic memory device M, and therefore elements with the same construction are assigned the same reference numerals and duplicated description thereof is omitted. In the magnetic memory device M1, since the voltage generating circuit 51 applies the intermediate voltage Vry via the parallel circuits 52 constructed of the resistors 52*a* and the diodes 52*b* to the read bit lines 5 and the voltage generating circuit 61 applies the intermediate voltage Vrx to the read word lines 6 via the parallel circuits 62 constructed of the resistors 62*a* and the diodes 62*b*, the same effects as the effects of the magnetic memory device X described above can be achieved.

Figure 4:
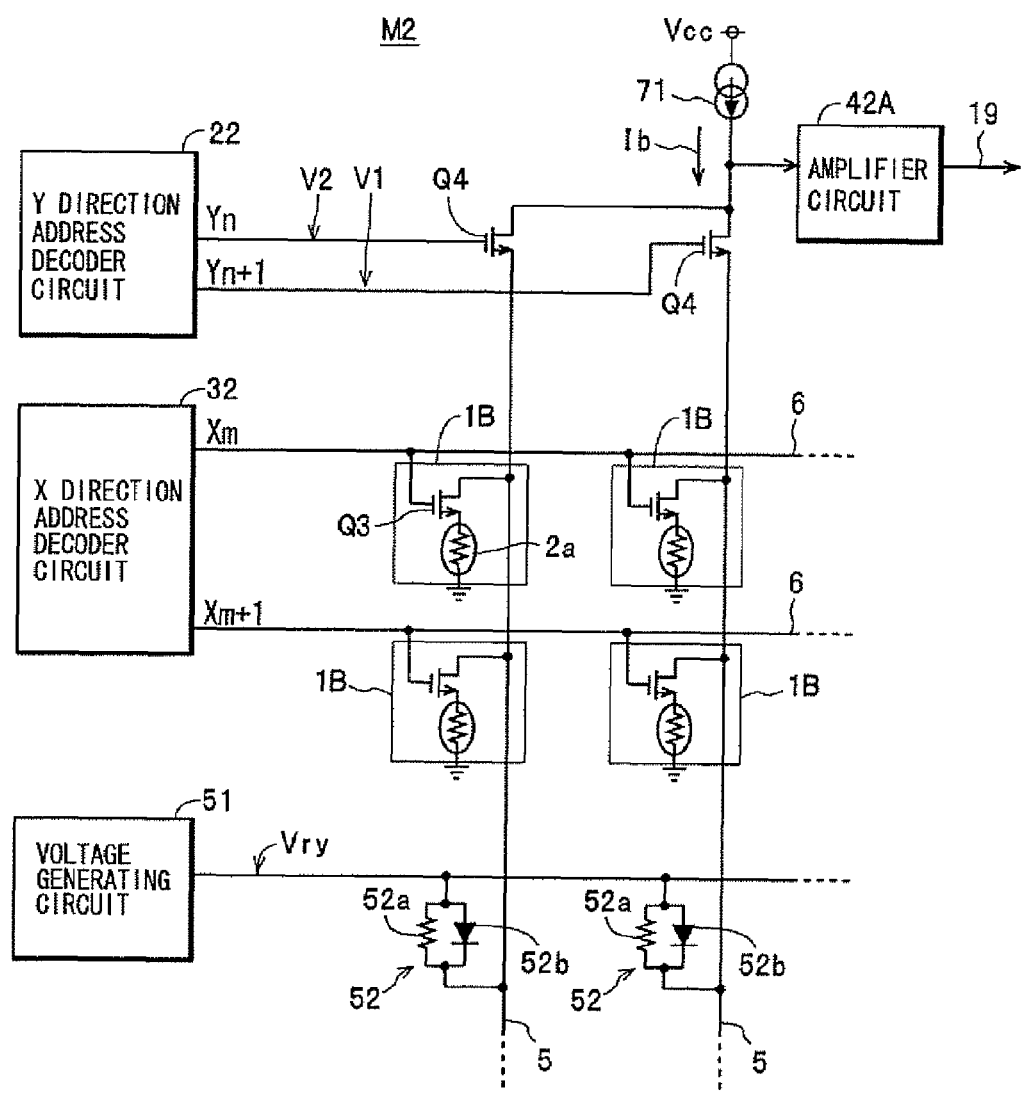
FIG. 4 is a circuit diagram showing the construction of circuits related to reading information in yet another magnetic memory device.
Figure 5:
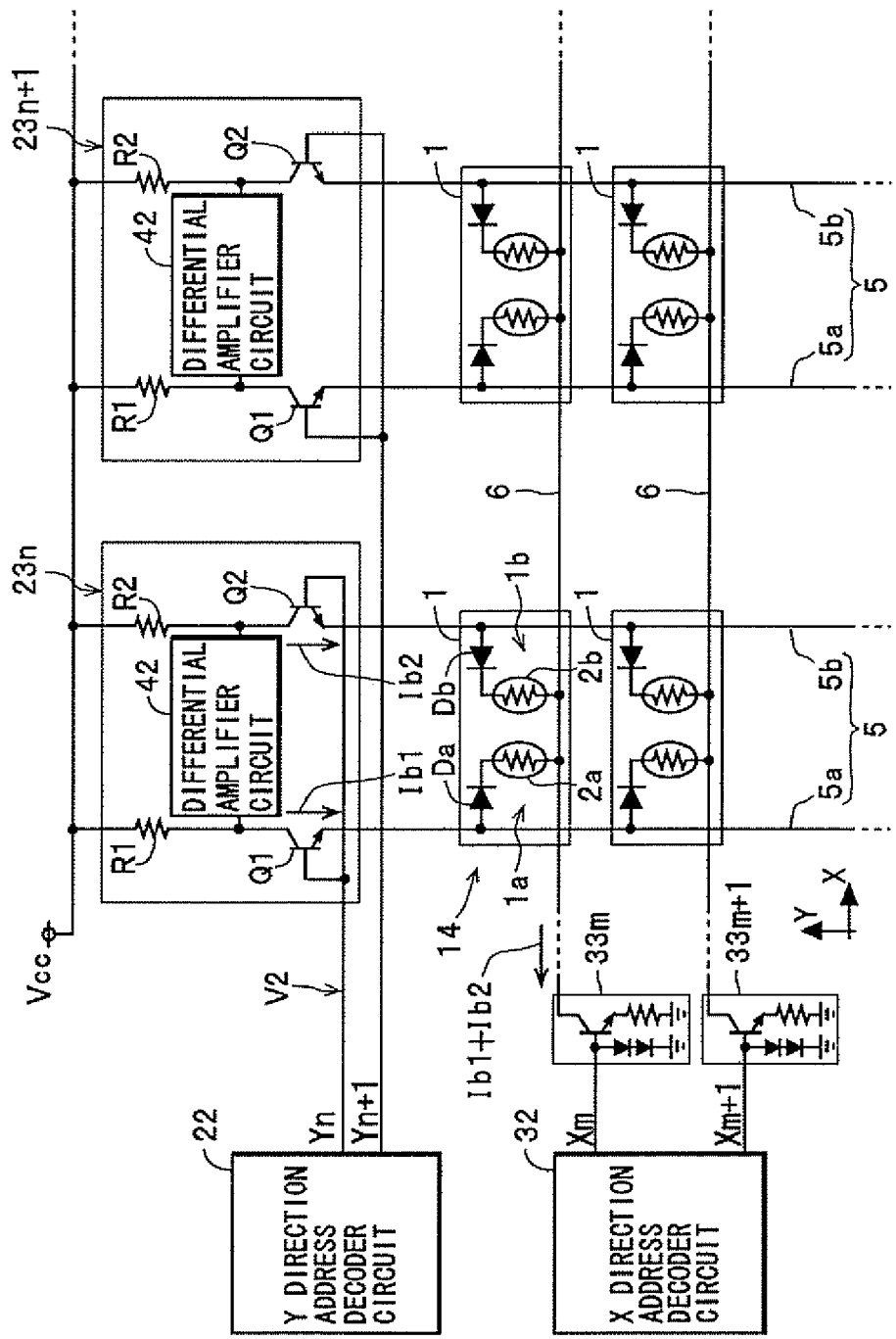
FIG. 5 is a circuit diagram showing the construction of circuits related to reading information in a conventional magnetic memory device.

Although bipolar transistors (as one example, NPN bipolar transistors) are used as switches in the magnetic memory devices M and M1 described above, as shown in FIG. 4 it is also possible to apply the present invention to a magnetic memory device M2 that uses field effect transistors. Only the characteristic construction of the magnetic memory device M2 will be described. Note that elements that are the same as in the magnetic memory devices M and M1 have been assigned the same reference numerals and duplicated description thereof is omitted. In the magnetic memory device M2, the respective storage cells 1B are each composed of a single magnetoresistive effect revealing body 2*a* and a single N-channel field effect transistor Q3. The gate terminal of the field effect transistor Q3 is connected to a read word line 6, the drain terminal is connected to a read bit line 5 as a read line, and the source terminal is connected to ground via the magnetoresistive effect revealing body 2*a*. One end of each read bit line 5 is connected to a source terminal of a field effect transistor Q4. Since a bit decode line Y is connected to the gate terminal, the field effect transistor Q4 changes to an ON state when selected by the Y direction address decoder circuit 22. The drain terminal of each field effect transistor Q4 is connected to a constant current source 71 and an amplifier circuit 42A. If the gate-source voltage of a field effect transistor Q4 when changing to the ON state is $V_{GS}$, the voltage of the bit decode line Y when changing the field effect transistor Q4 to the ON state is V2, and the voltage of the bit decode line Y when changing the field effect transistor Q4 to the OFF state is V1, the intermediate voltage Vry generated by the voltage generating circuit 51 is set at a desired voltage in a voltage range from the voltage ("low voltage") that is slightly higher than a voltage (V1-$V_{GS}$) to a voltage ("high voltage") that is slightly lower than the voltage (V2-$V_{GS}$), inclusive. Here, the intermediate voltage Vry should preferably be set equal to the voltage (V1-$V_{GS}$) or slightly higher. More specifically, in the present embodiment, the intermediate voltage Vry is set equal to the voltage (V1-$V_{GS}$).

In the magnetic memory device M2, when for example a bit decode line Y*n* is selected by the Y direction address decoder circuit 22, by applying the predetermined voltage to the bit decode line Y*n*, the field effect transistor Q4 changes to the ON state. When the word decode line X*m* is selected by the X direction address decoder circuit 32, the field effect transistors Q3 of all of the storage cells 1B connected to the word decode line X*m* change to the ON state by the predetermined voltage applied to the word decode line X*m*. By doing so, the current Ib generated in the constant current source 71 passes via the field effect transistor Q4 that is ON, the field effect transistor Q3 (that is ON) and the magnetoresistive effect revealing body 2a of the storage cell 1B disposed at the intersection of the bit decode line Yn and the word decode line Xm to ground. Here, the amplifier circuit 42A inputs a voltage determined by the current Ib and the resistance of the magnetoresistive effect revealing body 2a, amplifies the voltage, and outputs the voltage to the Y direction read data bus 19. By doing so, information of the storage cell 1B disposed at the intersection of the bit decode line Yn and the word decode line Xm is read.

In the magnetic memory device M2 also, since the intermediate voltage Vry can always be applied from the voltage generating circuit 51 to the read bit lines 5 in the state close to the floating state when the corresponding field effect transistor Q4 is OFF (i.e., in the non-selected state), the voltages of all of the read bit lines 5 in the non-selected state can be pulled up in advance to the intermediate voltage Vry. This means that even if the resistance and/or the parasitic capacitance of the read bit lines 5 is/are large, the field effect transistor Q4 selected by the bit decode line Y can start the charging of the parasitic capacitance from the intermediate voltage Vry, and therefore the charging of the parasitic capacitance can be completed within a short time following the field effect transistor Q4 switching to the selected state. Accordingly, since it is possible to rapidly switch to a state where the current Ib passes from the constant current source 71 to ground via the magnetoresistive effect revealing body 2a of the selected storage cell 1B, the read time of information from the storage cell 1B can be sufficiently reduced.

Also, although preferred embodiments where the intermediate voltage Vry (Vrx) is applied via the parallel circuits 52 (62) constructed of the resistors 52a (62a) and the diodes 52b (62b), it is possible to use a construction where the intermediate voltage Vry (Vrx) is applied via only one of the resistors 52a (62a) and the diodes 52b (62b).

What is claimed is:

1. A magnetic memory device comprising:
    a plurality of storage cells disposed in two dimensions;
    read lines that supply a read current for reading information from a first power supply to the respective storage cells; and
    a second power supply that is connected to at least some of the read lines and applies an intermediate voltage, which is lower than a voltage supplied by the first power supply, to the connected read lines.

2. A magnetic memory device according to claim 1,
    wherein the read lines include a plurality of read bit lines disposed in parallel and a plurality of read word lines disposed in parallel so as to intersect with the plurality of read bit lines,
    the storage cells are respectively disposed at or near intersections of the read bit lines and the read word lines and are connected to the read bit lines and the read word lines, and
    the second power supply applies the intermediate voltage to at least one of the plurality of read bit lines and the plurality of read word lines.

3. A magnetic memory device according to claim 1,
    wherein the second power supply is connected to the read lines via parallel circuits each composed of a resistor and a diode.

4. A magnetic memory device according to claim 2,
    wherein the second power supply is connected to the read lines via parallel circuits each composed of a resistor and a diode.

5. A magnetic memory device according to claim 1,
    wherein the intermediate voltage is set at a voltage that is at least a characteristic potential barrier of a semiconductor pn junction lower than the voltage supplied by the first power supply.

6. A magnetic memory device according to claim 2,
    wherein the intermediate voltage is set at a voltage that is at least a characteristic potential barrier of a semiconductor pn junction lower than the voltage supplied by the first power supply.

7. A magnetic memory device according to claim 3,
    wherein the intermediate voltage is set at a voltage that is at least a characteristic potential barrier of a semiconductor pn junction lower than the voltage supplied by the first power supply.

8. A magnetic memory device according to claim 4,
    wherein the intermediate voltage is set at a voltage that is at least a characteristic potential barrier of a semiconductor pn junction lower than the voltage supplied by the first power supply.

* * * * *